US012567562B2

(12) United States Patent
Watanabe

(10) Patent No.: US 12,567,562 B2
(45) Date of Patent: Mar. 3, 2026

(54) COMPENSATION OF IMPEDANCE MODULATION IN A PLASMA GENERATOR BY FREQUENCY SWEEP

(71) Applicant: Advanced Energy Industries, Inc., Denver, CO (US)

(72) Inventor: Masahiro Watanabe, Windsor, CO (US)

(73) Assignee: Advanced Energy Industries, Inc., Denver, CO (US)

( * ) Notice: Subject to any disclaimer, the term of this patent is extended or adjusted under 35 U.S.C. 154(b) by 527 days.

(21) Appl. No.: 18/086,307

(22) Filed: Dec. 21, 2022

(65) Prior Publication Data

US 2024/0212983 A1     Jun. 27, 2024

(51) Int. Cl.
H01J 37/32     (2006.01)

(52) U.S. Cl.
CPC ................... H01J 37/32155 (2013.01); *H01J 2237/24564* (2013.01); *H01J 2237/334* (2013.01)

(58) Field of Classification Search
CPC ................. H01J 37/32; H01J 37/32155; H01J 37/32183; H01J 2237/24564; H01J 37/24564
See application file for complete search history.

(56) References Cited

U.S. PATENT DOCUMENTS 5,556,501 A * 9/1996 Collins ............. H01J 37/32458
257/E21.252
5,824,607 A * 10/1998 Trow ................. H01J 37/32623
118/723 MR 6,444,137 B1 * 9/2002 Collins ............. H01J 37/32174
257/E21.252
6,545,420 B1 * 4/2003 Collins ................ H01J 37/3211
257/E21.252
7,839,223 B2 11/2010 Van Zyl et al.
8,743,575 B2 6/2014 Nymand
9,294,100 B2 3/2016 Van Zyl
9,337,804 B2 5/2016 Mason
9,711,331 B2 7/2017 Mueller et al.
9,736,921 B2 * 8/2017 Nagami ................... H05H 1/46
(Continued)

FOREIGN PATENT DOCUMENTS

WO     WO-2024137944 A1 *  6/2024   ........ H01J 37/32155

OTHER PUBLICATIONS

International Search Report and Written Opinion regarding PCT/US2023/05357, Apr. 18, 2024, 15 Pages, Published in US.

*Primary Examiner* — Srinivas Sathiraju
(74) *Attorney, Agent, or Firm* — NOD Law PC

(57)     ABSTRACT

A plasma processing system is disclosed. A very high frequency (VHF) generator delivers power to a plasma chamber, and a mid-frequency (MF) generator delivers power to the plasma chamber. The VHF generator includes a sensor configured to provide a signal indicative of an impedance of a plasma load that is presented to the VHF generator. The VHF generator further includes a frequency tuner configured to adjust a frequency of the VHF generator within a cycle of the MF generator based on the signal to mitigate impedance modulation caused by the MF generator. Impedance modulation may also be mitigated by a sync line between the VHF and MF generators that allows presetting the VHF generator frequency in synchronization with a cycle of the MF generator.

17 Claims, 8 Drawing Sheets

(56)  References Cited

U.S. PATENT DOCUMENTS

| | | | |
|---|---|---|---|
| 9,854,659 | B2 | 12/2017 | Van Zyl |
| 10,026,595 | B2 | 7/2018 | Choi et al. |
| 10,790,126 | B2 * | 9/2020 | Kawasaki ......... H01J 37/32128 |
| 11,315,757 | B2 * | 4/2022 | Martinez ........... H01J 37/32146 |
| 11,380,530 | B2 * | 7/2022 | Weichart ............. C23C 14/0036 |
| 11,610,761 | B2 * | 3/2023 | Fairbairn ............ C23C 16/4586 |
| 11,615,941 | B2 * | 3/2023 | Brouk ............... H01J 37/32174 |
| | | | 315/111.21 |
| 11,670,487 | B1 * | 6/2023 | Nguyen ................... H03K 3/57 |
| | | | 307/52 |
| 11,671,953 | B2 * | 6/2023 | Shintani ............. H04N 21/4383 |
| | | | 370/329 |
| 11,935,726 | B2 * | 3/2024 | Radomski ......... H01J 37/32146 |
| 2004/0107909 | A1 * | 6/2004 | Collins ............. H01J 37/32412 |
| | | | 118/723 I |
| 2004/0166612 | A1 * | 8/2004 | Maydan ................ H01J 37/321 |
| | | | 438/149 |
| 2004/0200417 | A1 * | 10/2004 | Hanawa ............ H01L 21/02126 |
| | | | 118/723 I |
| 2005/0051272 | A1 * | 3/2005 | Collins ................. H01J 37/321 |
| | | | 156/345.48 |
| 2005/0136604 | A1 * | 6/2005 | Al-Bayati ............ H10D 30/024 |
| | | | 438/301 |
| 2017/0099723 | A1 * | 4/2017 | Nagami ............ H01J 37/32091 |
| 2019/0362941 | A1 * | 11/2019 | Kawasaki ......... H01J 37/32935 |
| 2020/0066489 | A1 | 2/2020 | Lozic et al. |
| 2020/0388474 | A1 * | 12/2020 | Weichart ............. H01J 37/3405 |
| 2021/0050185 | A1 * | 2/2021 | Martinez ........... H01J 37/32183 |
| 2022/0005674 | A1 * | 1/2022 | Radomski ......... H01J 37/32174 |
| 2022/0139674 | A1 | 5/2022 | Shaw et al. |
| 2023/0098458 | A1 * | 3/2023 | Shintani ............. H04N 21/4856 |
| | | | 370/329 |
| 2024/0212983 | A1 * | 6/2024 | Watanabe ......... H01J 37/32183 |

* cited by examiner

300

700

APPLY POWER TO
PLASMA CHAMBER WITH
VHF GENERATOR                      702

APPLY POWER TO
PLASMA CHAMBER WITH
MF GENERATOR                       704

PRESET VHF FREQUENCY
TO BE SYNC'D WITH
SYNC SIGNAL                        706

DECREASE
VHF FREQUENCY
WHEN INDICATED
BY SYNC                            708

INCREASE
VHF FREQUENCY
WHEN INDICATED
BY SYNC                            710

COMPENSATION OF IMPEDANCE MODULATION IN A PLASMA GENERATOR BY FREQUENCY SWEEP

BACKGROUND

Field

The presently disclosed embodiments relate generally to plasma processing systems, and more specifically to plasma processing systems with modulated plasma.

Background

Plasma processing systems for etching and deposition have been utilized for decades, but advancements in processing techniques and equipment technologies continue to create increasingly more complex systems. These increasingly complex systems lead to more problematic interactions between multiple generators driving the same plasma system.

SUMMARY

One aspect of this disclosure may be characterized as a plasma processing system comprising a very high frequency (VHF) generator configured to deliver power to a plasma chamber, and a mid-frequency (MF) generator configured to deliver power to the plasma chamber. The VHF generator comprises a sensor configured to produce at least one signal indicative of an impedance of a plasma load that is presented to the VHF generator, and a frequency tuner configured to adjust a frequency of the VHF generator within a cycle of the MF generator based on the sensed impedance to mitigate impedance modulation caused by the MF generator.

Another aspect of this disclosure may be characterized as plasma processing system that includes a very high frequency (VHF) generator configured to deliver power to a plasma chamber, and a mid-frequency (MF) generator configured to deliver power to the plasma chamber. A sync line is provided between the VHF generator and the MF generator for permitting presetting of a frequency of the VHF generator in synchronization with a cycle of the MF generator so as to adjust the frequency of the VHF generator in order to mitigate impedance modulation caused by the MF generator.

A further aspect of this disclosure may be characterized as a method for compensation of impedance modulation in a plasma chamber. The method includes delivering power to the plasma chamber with a very high frequency (VHF) generator; delivering power to the plasma chamber with a mid-frequency (MF) generator; sensing an impedance of a plasma load that is presented to the VHF generator; and adjusting a frequency of the VHF generator within a cycle of the MF generator based on the sensed impedance in order to mitigate impedance modulation caused by the MF generator.

A still further aspect of this disclosure may be characterized as a method for compensation of impedance modulation in a plasma chamber. The method includes delivering power to the plasma chamber with a very high frequency (VHF) generator; delivering power to the plasma chamber with a mid-frequency (MF) generator; synchronizing the VHF generator and the MF generator; and presetting a frequency of the VHF generator in synchronization with a cycle of the MF generator so as to adjust the frequency of the VHF generator in order to mitigate impedance modulation caused by the MF generator.

DETAILED DESCRIPTION

Interaction between generators driving the same plasma where one of the generators modulates the load seen by another generator is becoming increasingly problematic as power levels are increased; thus, there is a need for new and improved methods and systems for dealing with this problem.

The word "exemplary" is used herein to mean "serving as an example, instance, or illustration." Any embodiment described herein as "exemplary" is not necessarily to be construed as preferred or advantageous over other embodiments.

Some plasma etch applications, such as high aspect ratio contact (HARC) etch applications in one non-limiting example, typically use dual frequency capacitively coupled plasma (CCP) configurations (sometimes also referred to as dual frequency bias configurations) that apply both VHF (very high frequency) and MF (mid frequency) power to a plasma chamber. In this regard, although this description focuses primarily on CCP or bias configurations, the principles of this disclosure may also be applied to inductive coupling configurations.

Figure 1:
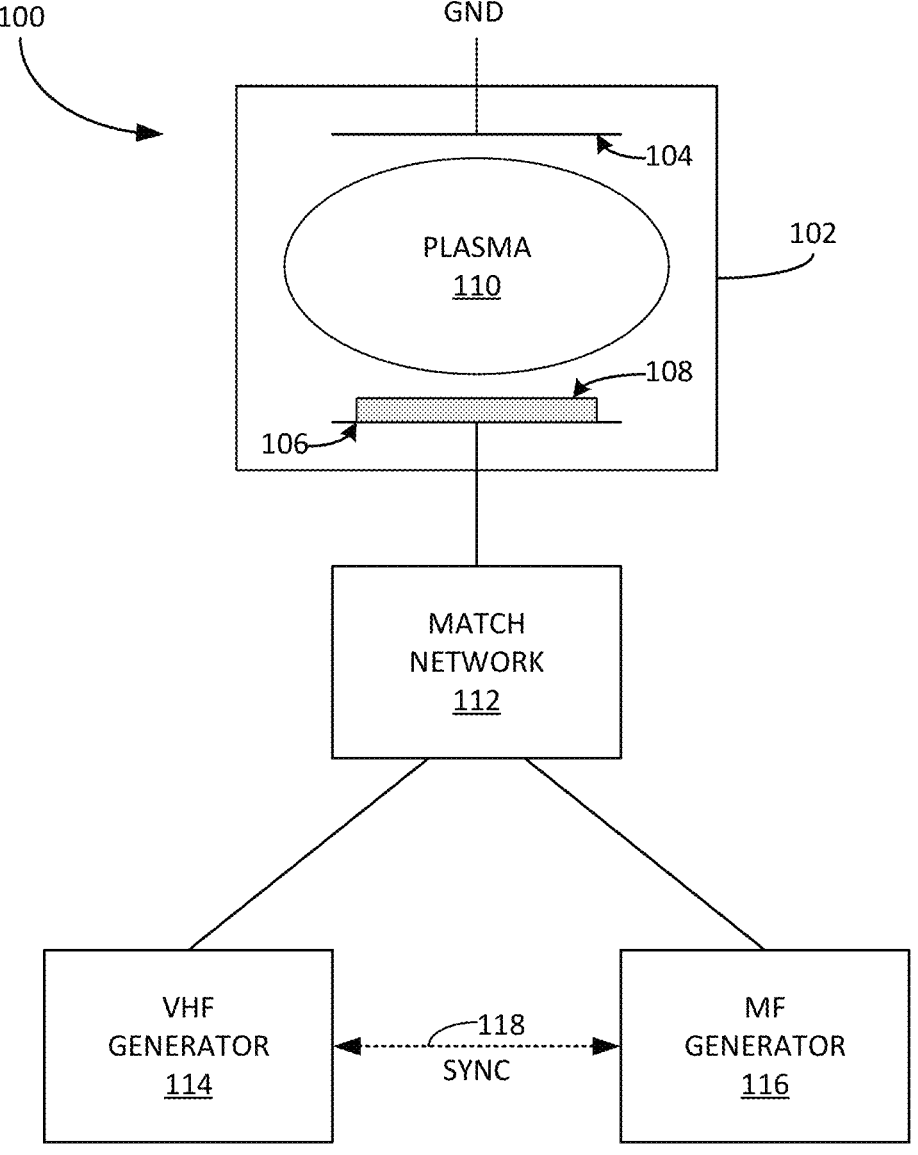
FIG. 1 is a conceptual block diagram of a plasma processing system that includes VHF and MF generators, in accordance with embodiments disclosed herein.

FIG. 1 is a conceptual block diagram of a plasma processing system 100 that includes VHF generator 114 and MF generator 116, in accordance with embodiments disclosed herein. In the following description, VHF generator 114 may be any type of generator that operates at frequencies in a relatively high frequency range (such as for example, about 10 MHz to about 200 MHz), and MF generator 116 may be any type of generator that operates at frequencies in a relatively mid frequency range (such as, for example, about 100 kHz to about 2 MHz). The guiding principle is that the frequency range of VHF generator 114 should be higher than the frequency range of MF generator 116. MF generator 116 may be, for example, a sinusoidal wave generator, a pulsed DC voltage (bias supply) generator, or any other type of generator operating in a frequency range lower than that of VHF generator 114. As a specific example, the MF generator may apply an asymmetrical periodic voltage waveform to the substrate support 106. Examples of an asymmetrical periodic voltage waveform are described in U.S. Pat. No. 10,707,055 entitled "Spatial and Temporal Control of Ion Bias Voltage for Plasma Processing," issued Jul. 7, 2020, which is incorporated herein by reference.

As shown in FIG. 1, plasma chamber 102 is coupled to VHF generator 114 and MF generator 116 via match network 112. In some embodiments, match network 112 may be a combined network for both VHF generator 114 and MF generator 116, and in other embodiments, match network 112 may comprise a match network for VHF generator 114 and a separate match network for MF generator 116. In other embodiments, match network 112 may be omitted such that there is no match network between VHF and MF generators 114, 116 and plasma chamber 102. Plasma chamber 102 includes a first grounded electrode 104 and a second electrode (RF electrode) or substrate support 106 on which a substrate (e.g., wafer) 108 is mounted and exposed to plasma 110 within chamber 102. Power is applied by VHF and MF generators 114, 116 to the substrate support 106.

The operations of VHF generator 114 and MF generator 116 may also be capable of being synchronized, as is shown by sync line 118 in FIG. 1. For example, in some embodiments, sync line 118 provides a common exciter (CEX) mode such that VHF generator 114 and MF generator 116 operate in a fixed phase relationship. In other embodiments, sync line 118 provides a clock signal on which synchronization of generators 114 and 116 may be based. In sum, sync line 118 may be any mechanism capable of synchronizing VHF generator 114 and MF generator 116.

Although VHF generator 114 and MF generator 116 may each operate over a broad range of frequencies, in general, VHF generator 114 operates at a frequency that is higher than MF generator 116. In some embodiments, for example, VHF generator 114 may deliver RF power in the approximately 10 MHz to approximately 200 MHz frequency range, and MF generator 116 may deliver RF power in the approximately 100 kHz to approximately 2 MHz range. In one example, VHF generator delivers power in the frequency range of about 60 MHz, and MF generator delivers power in the frequency range of about 400 kHz. While these frequency ranges are typical, it should be noted that they are provided for non-limiting purposes of illustration only, and the frequency ranges of VHF generator 114 and MF generator 116 may be broader (or narrower) than these exemplary ranges, so long as the frequency range of VHF generator 114 is higher than the frequency range of MF generator 116.

In some embodiments, VHF generator 114 is configured to ignite and sustain the plasma 110 in plasma chamber 102, and MF generator 116 is configured to bias substrate (e.g., wafer) 108 by applying a periodic voltage function to substrate support (RF electrode) 106 to effectuate a desired distribution of ion energies at a surface of substrate 108. In other embodiments, VHF generator 114 is configured to sustain the plasma, and either or both of VHF generator 114 and MF generator 116 may be configured to ignite the plasma. In still further embodiments, VHF generator 114 is configured to contribute to some extent to biasing substrate (e.g., wafer) 108, and MF generator 116 is configured to contribute to some extent to sustaining plasma 110.

In some applications, such as HARC etching for components such as memories, very high MF power is required. In some embodiments, for example, MF generator 116 may apply a relatively high amount of power (e.g., in one non-limiting example, in the approximately 10 KW to approximately 30 KW range) to the plasma load of plasma chamber 102. Due to non-linear plasma properties, this high amount of power applied to the plasma at low frequency causes modulation of the impedance presented to VHF generator 114, which in turn leads to amplitude modulation in the forward and reflected power. As MF power is increased, impedance modulation and the consequent amplitude modulation of forward and reflected power becomes more severe, and the net VHF power into the plasma for a given forward power is reduced. Sometimes, the net VHF power may be half or less of the forward power, requiring an increase in the forward power supplied by the VHF generator to achieve a desired net power. Moreover, the high amount of reflected power may cause stress and damage to the VHF generator. Known solutions to this issue are expensive and may include, for example, use of an external RF device to protect the VHF generator from high reflected power, and/or use of a VHF generator that has higher power handling capability. The present disclosure seeks to provide a more efficient and economical solution to these issues.

Figure 2A:
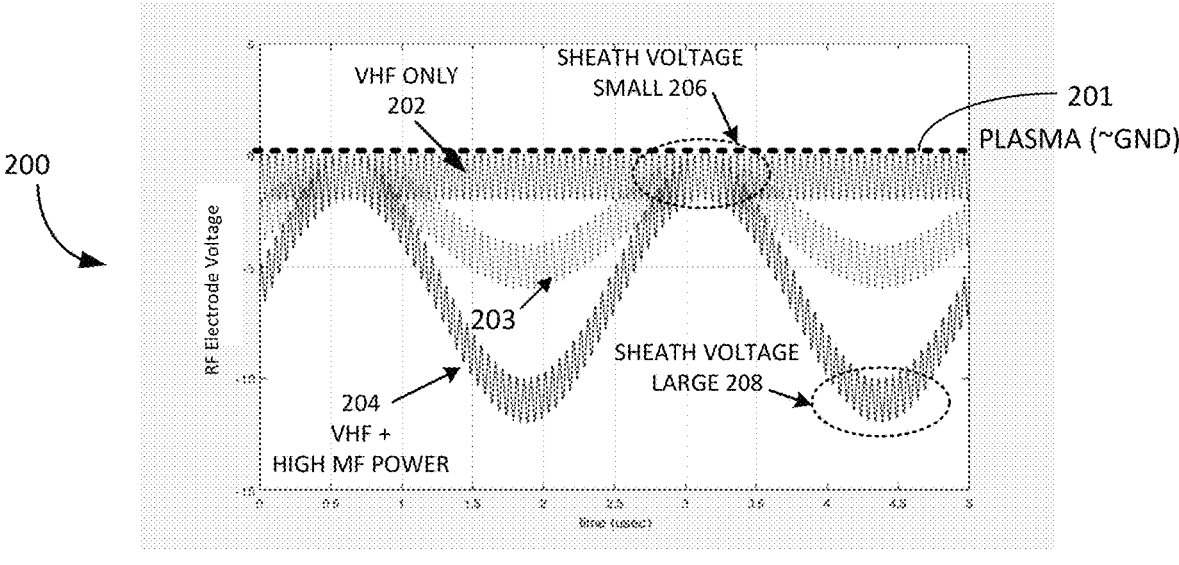
FIG. 2A is a graph depicting RF electrode voltages and sheath voltages in a plasma processing system that includes VHF and MF generators, in accordance with embodiments disclosed herein.
Figure 2B:
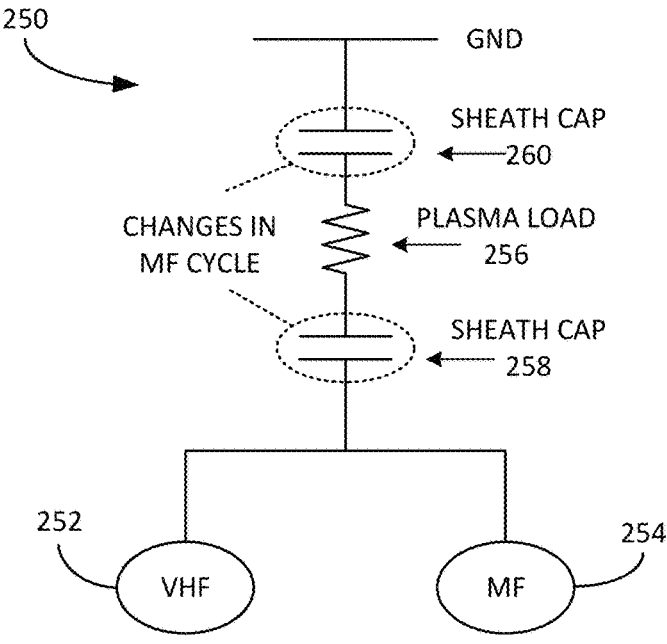
FIG. 2B is a conceptual diagram showing an equivalent circuit for the plasma processing system of FIG. 1, in accordance with embodiments disclosed herein.

FIGS. 2A and 2B are illustrative of the causes of the impedance modulation that give rise to high amounts of reflected power. FIG. 2A is a graph 200 depicting various waveforms in a plasma processing system that includes VHF and MF generators, such as plasma processing system 100 of FIG. 1. In FIG. 2A, the x-axis represents time and the y-axis represents the RF electrode voltage (voltage at substrate support 106). The plasma voltage 201 (which is approximately ground or zero) is shown for reference as a dotted line. Waveform 202 is the RF electrode voltage when VHF power only is applied; waveform 204 is the RF electrode voltage when VHF power and relatively higher MF power is applied; and waveform 203 is the RF electrode voltage when VHF power and relatively lower MF power is applied.

Sheath voltage, which is the difference between the plasma voltage and the RF electrode voltage, can also be seen in FIG. 2A. When VHF power only is applied, the sheath voltage (voltage difference between plasma voltage 201 and VHF power only waveform 202) is lower and is very stable and uniform. Upon application of relatively high MF power and VHF power, as illustrated by waveform 204, the sheath voltage becomes less uniform and subject to substantial variation during the MF cycle. In particular, the sheaf voltage cycles between areas of relatively high sheath voltage, as depicted by region 208, and areas of relatively low sheath voltage, as depicted by region 206.

FIG. 2B is a conceptual diagram depicting an equivalent circuit 250 for a plasma processing system that includes a VHF generator 252 and an MF generator 254. Circuit 250 includes the equivalent resistance 256 presented by the plasma load as well as equivalent sheath capacitance 258 between substrate (e.g., wafer) 108 and plasma 110, and equivalent sheath capacitance 260 between electrode 104 and ground. The variations in sheath voltage, as shown in FIG. 2A, result in variations during the MF cycle in the equivalent sheath capacitances 258 and 260 (with sheath capacitance 258 being the dominating mechanism), which in turn modulates the impedance seen by VHF generator 114 and consequently modulates the amplitude of the forward and reflected power. In particular, when the sheath voltage is low (region 206), sheath capacitance 258 becomes larger, and when the sheath voltage is high, sheath capacitance 258 becomes smaller. Plasma load may also vary during the MF cycle to some extent, which may also contribute to impedance modulation and power amplitude modulation.

Figure 3:
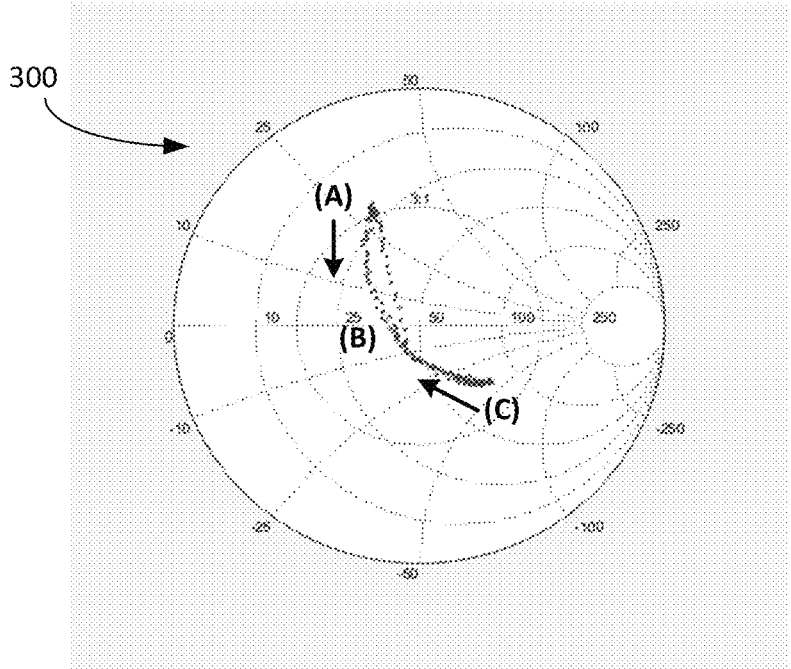
FIG. 3 is a graph depicting an example of impedance modulation in the plasma processing system of FIG. 1, in accordance with embodiments disclosed herein.

FIG. 3 is a graph (Smith chart) 300 showing an example of impedance modulation seen by VHF generator 114 due to high power MF generator 116. The impedance ("target impedance") in this example is around point B in the graph, or about 50 ohms. Although 50 ohms is typical, this is a non-limiting example and the target impedance may be other values. The variations in sheath capacitance described above cause variations in the impedance that is seen by VHF generator 114. In particular, the impedance may "swing" between a first impedance (point A) and a second impedance (point C). More specifically, the first impedance (point A) is where the impedance has swung in a first direction away from a target impedance (point B) (and at point A the sheath capacitance is larger than a target sheath capacitance) and a second impedance (point C) is where the impedance has swung in a second direction away from the target impedance (point B) where the second direction is opposite (relative to point B) from the first direction, and at the second impedance (point C), the sheath capacitance is smaller than the target sheath capacitance.

In accordance with aspects of this disclosure, applicant has found that the impedance swing or modulation caused by the high level of power applied by MF generator 116 can be compensated (reduced) by utilizing the frequency tuning capabilities of VHF generator 114. VHF generator 114 typically has a range of frequencies that can be generated beyond its rating. A 60 MHz VHF generator, for example typically has a range of plus or minus five percent. Thus, the 60 MHz VHF generator can typically be operated in a range from about 57 MHz to about 63 MHz. By adjusting the frequency of the VHF generator within this range, applicant has found that the impedance modulation swings can be "pushed" back towards the ideal target impedance of about 50 ohms.

Figures 4A, 4B, 4C:
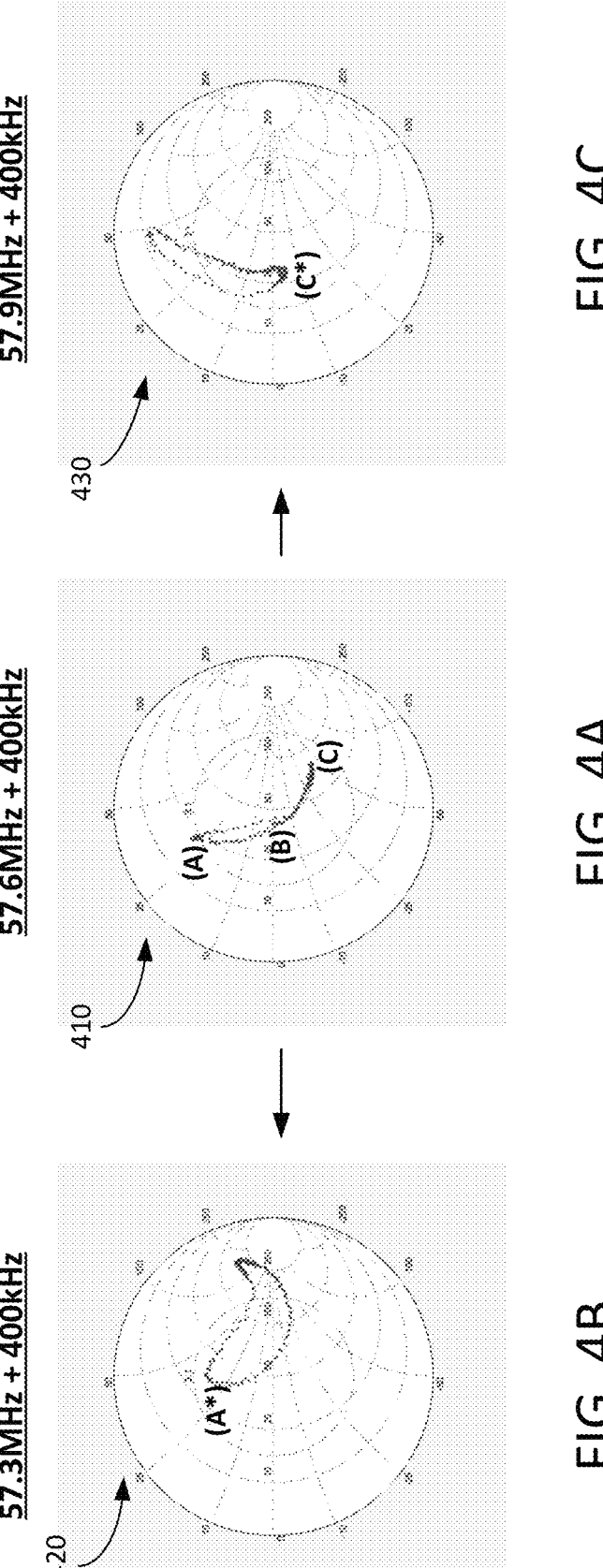
FIG. 4A is a graph depicting an example of impedance modulation in the plasma processing system of FIG. 1, in accordance with embodiments disclosed herein.
FIG. 4B is a graph depicting compensation of impedance modulation by decreasing VHF frequency, in accordance with embodiments disclosed herein.
FIG. 4C is a graph depicting compensation of impedance modulation by increasing VHF frequency, in accordance with embodiments disclosed herein.

This concept is illustrated in the graphs of FIGS. 4A-4C. In graph 410 of FIG. 4A, VHF generator 114 is operating at 57.6 MHz and MF generator 416 is operating at 400 kHz. In this state of operation, the impedance seen by VHF generator 114 "swings" between a first impedance (point A) when the sheath capacitance is at its largest, and a second impedance (point C) when the sheath capacitance is at its smallest.

When sheath capacitance is at its largest and impedance consequently swings to point A, impedance can be pushed back towards the target impedance (point B) of, e.g., 50 ohms by decreasing the frequency of VHF generator 114. In this regard, as shown in graph 420 of FIG. 4B, when impedance swings to point A, the frequency of VHF generator 114 is reduced to 57.3 MHz. Consequently, the impedance swings back towards the target impedance of 50 ohms (FIG. 4B; point A*).

Similarly, when sheath capacitance is at its smallest and impedance after swinging in an opposite direction from the impedance at point A to an impedance at point C, the impedance can be pushed back towards the target impedance (point B) of 50 ohms by increasing the frequency of VHF generator 114. In this regard, as shown in graph 430 of FIG.

4C, when impedance swings to its high point C, the frequency of VHF generator 114 is increased to 57.9 MHz. Consequently, the impedance swings back towards the target impedance of 50 ohms (FIG. 4C; point C*).

Figure 5:
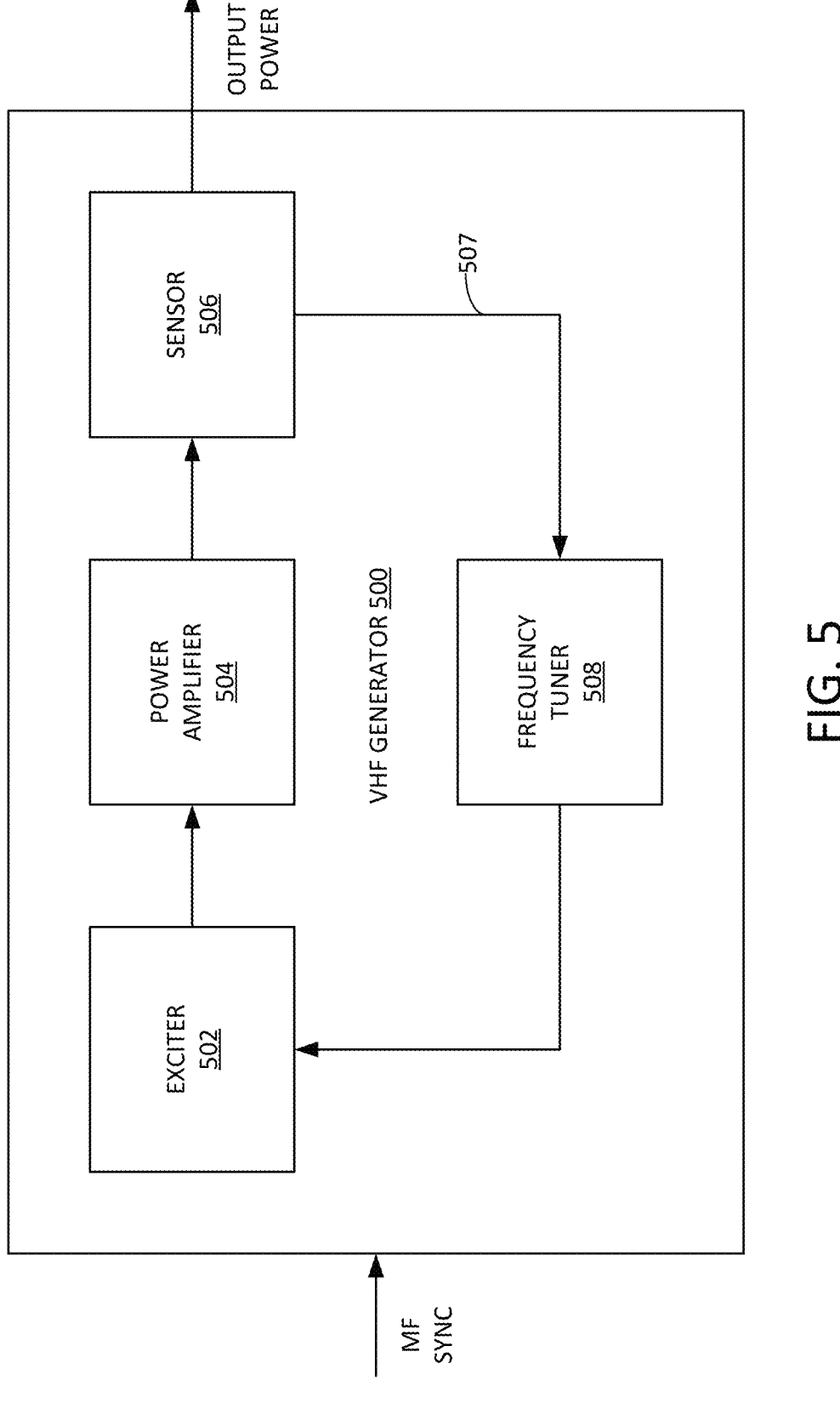
FIG. 5 is a conceptual block diagram of a VHF generator, in accordance with embodiments disclosed herein.

Thus, an aspect of the present disclosure is frequency tuning of VHF generator 114 to adjust a modulating impedance that is presented to VHF generator 114. In this regard, FIG. 5 shows a block diagram of a VHF generator 500 that may be used to realize VHF generator 114 described with reference to FIG. 1. As shown, VHF generator includes exciter 502, power amplifier 504, sensor 506, and frequency tuner 508. Exciter 502 generates an oscillating signal at RF frequencies, typically in the form of a sinusoidal or square wave. Power amplifier 504 amplifies the signal produced by exciter 502 to produce an amplified oscillating signal. For example, power amplifier 504 may amplify an exciter output signal of 1 mW to 3 KW. Sensor 506 measures one or more aspects of the power applied by the VHF generator and produces at least one signal 507 that is indicative of the impedance Z of the plasma load presented to VHF generator 500. Sensor 506 may be, for example and without limitation, a VI sensor to produce a voltage signal and current signal or a directional coupler to produce a forward voltage signal and a reflected voltage signal.

Frequency tuner 508 receives measurements indicative of the impedance of the plasma load seen by VHF generator 500 and processes those measurements to produce frequency adjustments that are fed to exciter 502 to adjust the frequency generated by exciter 502. In particular, as described with reference to FIGS. 4A-4C, when sheath capacitance is at larger than a target sheath capacitance and the impedance sensed by sensor 506 swings to point A, frequency tuner 508 may decrease the frequency of VHF generator 500 to cause impedance to be pushed back towards the target impedance (point B) of, e.g., 50 ohms. Likewise, when sheath capacitance is smaller than a target sheath capacitance and the impedance sensed by sensor 506 swings to point C, frequency tuner 508 may increase the frequency of VHF generator 500 to cause impedance to be reduced or pushed back towards the target impedance (point B) of 50 ohms.

It is contemplated that, depending upon the hardware configuration, when sheath capacitance is smaller than a target sheath capacitance, the frequency tuner 508 may need to decrease the frequency of VHF generator 500 to cause impedance to be reduced or pushed back towards the target impedance (point B) of, e.g., 50 ohms. Likewise, depending upon the hardware configuration, it is contemplated that when sheath capacitance is smaller than a target sheath capacitance, the frequency tuner 508 may need to decrease the frequency of VHF generator 500 to cause impedance to be reduced or pushed back towards the target impedance (point B) of, e.g., 50 ohms. It should also be recognized that, although sheath capacitance is identified as one reason for impedance modulation, sheath capacitance is not the only reason for impedance modulation. For example, the impedance of plasma body and the sheath capacitance both contribute to the total impedance.

In addition, as described with reference to FIG. 1, the operations of VHF generator 114 and MF generator 116 may be capable of being synchronized, as is shown by MF sync line 118. For example, sync line 118 may provide a common exciter (CEX) mode such that VHF generator 114 and MF generator 116 operate in a fixed phase relationship. Synchronization of generators 114 and 116 may also be provided, for example, by a clock signal or the like on sync line 118. Synchronization in this manner may allow the frequency of VHF generator 114 to be preset in synchronicity with the cycle of MF generator 116, so as to increase and decrease its frequency at appropriate times such that the impedance seen by VHF generator 114 is continuously modulated to be as close to the target impedance as possible.

Figure 6:
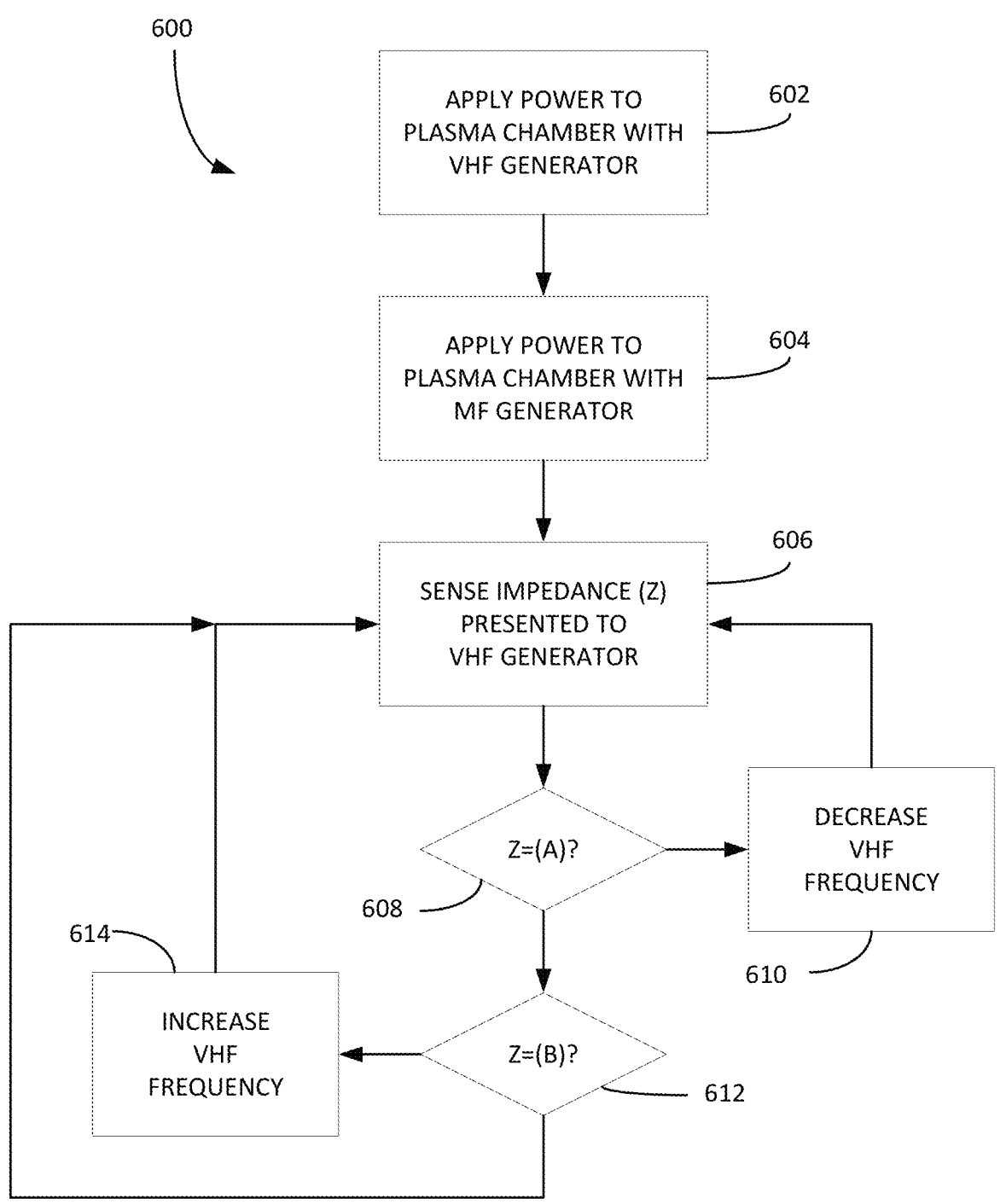
FIG. 6 is a flowchart depicting a method for compensating impedance modulation by frequency control, in accordance with embodiments disclosed herein.

FIG. 6 is a flowchart depicting a method 600 for compensating impedance modulation by frequency control, in accordance with embodiments disclosed herein. In step 602, power is applied to plasma chamber 102 with VHF generator 114/500. As described above, the power applied by VHF generator 114/500 is typically in the range of about 60 MHz and typically serves to sustain (and possibly ignite) the plasma 110 in plasma chamber 102. In step 604, power is applied to plasma chamber 102 with MF generator 116. As described above, the power applied by MF generator 116 is typically in the range of about 400 KHz and typically serves to bias substrate 108 by applying a periodic voltage function to substrate support 106 to effectuate a desired distribution of ion energies at a surface of substrate 108.

In step 606, the impedance presented to VHF generator 114/500 by the plasma load is sensed. The impedance may be sensed, for example, by a sensor such as sensor 506 in FIG. 5. In step 608, if impedance has swung or modulated to point A (FIGS. 3 and 4), the frequency of VHF generator 114/500 is reduced in step 610 to push the impedance back towards the target impedance (typically, although certainly not always, 50 ohms). Step 610 may be carried out, for example, by frequency tuner 508 of FIG. 5. In step 612, if impedance as sensed by sensor 506 has swung or modulated to point C (FIGS. 3 and 4), the frequency of VHF generator 114/500 is increased in step 614 to push the impedance back towards the target impedance. Step 614 may be carried out, for example, by frequency tuner 508 of FIG. 5.

Figure 7:
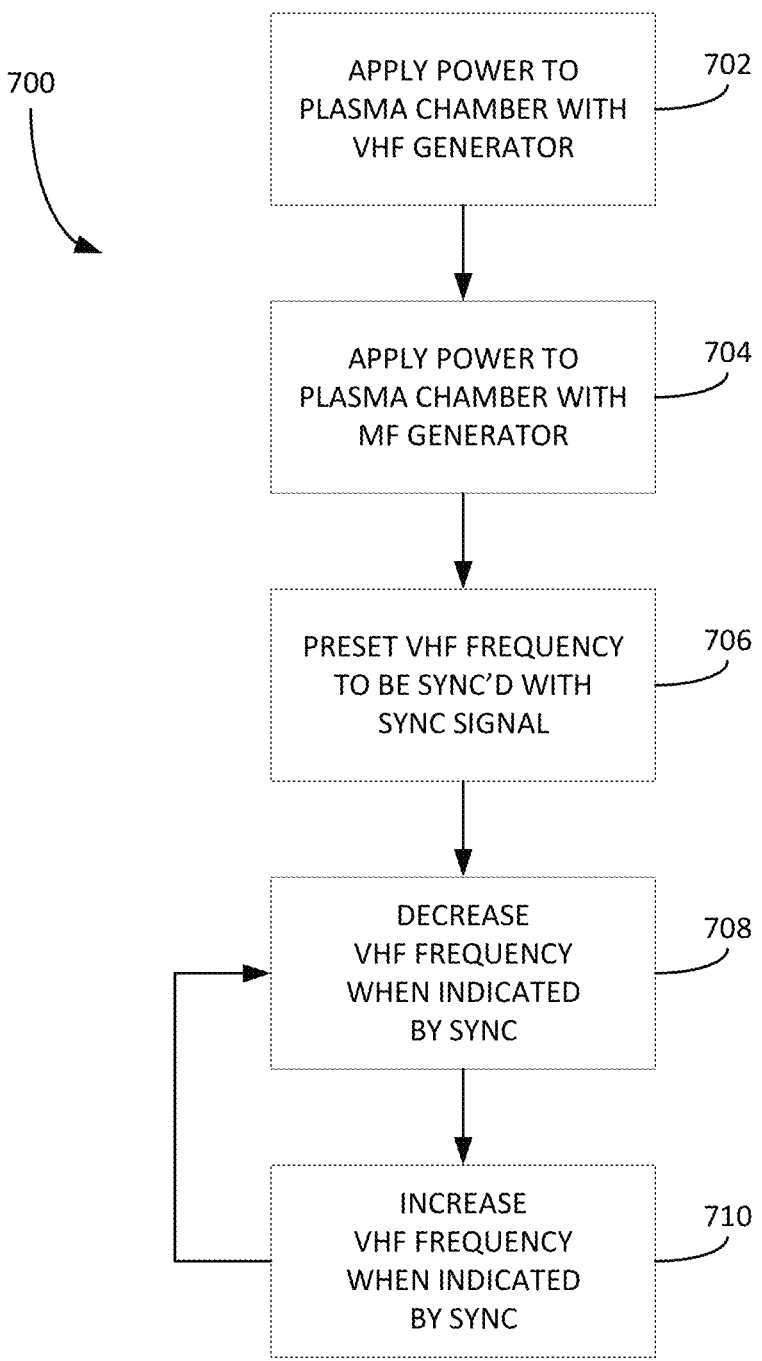
FIG. 7 is a flowchart depicting a method for compensating impedance modulation by frequency synchronization, in accordance with embodiments disclosed herein.

FIG. 7 is a flowchart depicting an alternative method 700 for compensating impedance modulation by frequency synchronization, in accordance with embodiments disclosed herein. In step 702, power is applied to plasma chamber 102 with VHF generator 114/500. As described above, the power applied by VHF generator 114/500 is typically in the range of 60 MHz and serves to ignite and sustain the plasma 110 in plasma chamber 102. In step 704, power is applied to plasma chamber 102 with MF generator 116. As described above, the power applied by MF generator 116 may be in the range of 400 kHz and serves to bias substrate 108 by applying a periodic voltage function to substrate support 106 to effectuate a desired distribution of ion energies at a surface of substrate 108.

In step 706, the frequency output of VHF generator 114/500 is preset to be sync'd with the cycles of MF generator 116. As previously described, for example, a common exciter (CEX) mode may be provided by sync line 118 such that VHF generator 114 and MF generator 116 operate in a fixed phase relationship. Synchronization of generators 114 and 116 may also be provided, for example, by a clock signal or the like on sync line 118. By presetting frequency modulation of VHF generator 114/500 in this fashion, the frequency of VHF generator 114/500 is automatically adjusted in correspondence with the cycle of MF generator 116, such that there is no need to continuously sense the impedance seen by VHF generator 114/500 and adjust the frequency output of VHF generator 114/500 accordingly.

In step 708, in accordance with the presetting of VHF generator 114/500, VHF frequency is decreased when indicated by the sync signal, to modulate the impedance seen by the VHF frequency generator back towards the target impedance. Likewise, in step 710, VHF frequency is increased when indicated by the sync signal, so as to modulate the impedance seen by the VHF frequency generator back towards the target impedance.

Those of skill in the art will understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill will further appreciate that the various illustrative logical blocks, modules, circuits, and algorithm steps described in connection with the embodiments disclosed herein may be implemented as electronic hardware, computer software, or combinations of both. The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

Figure 8:
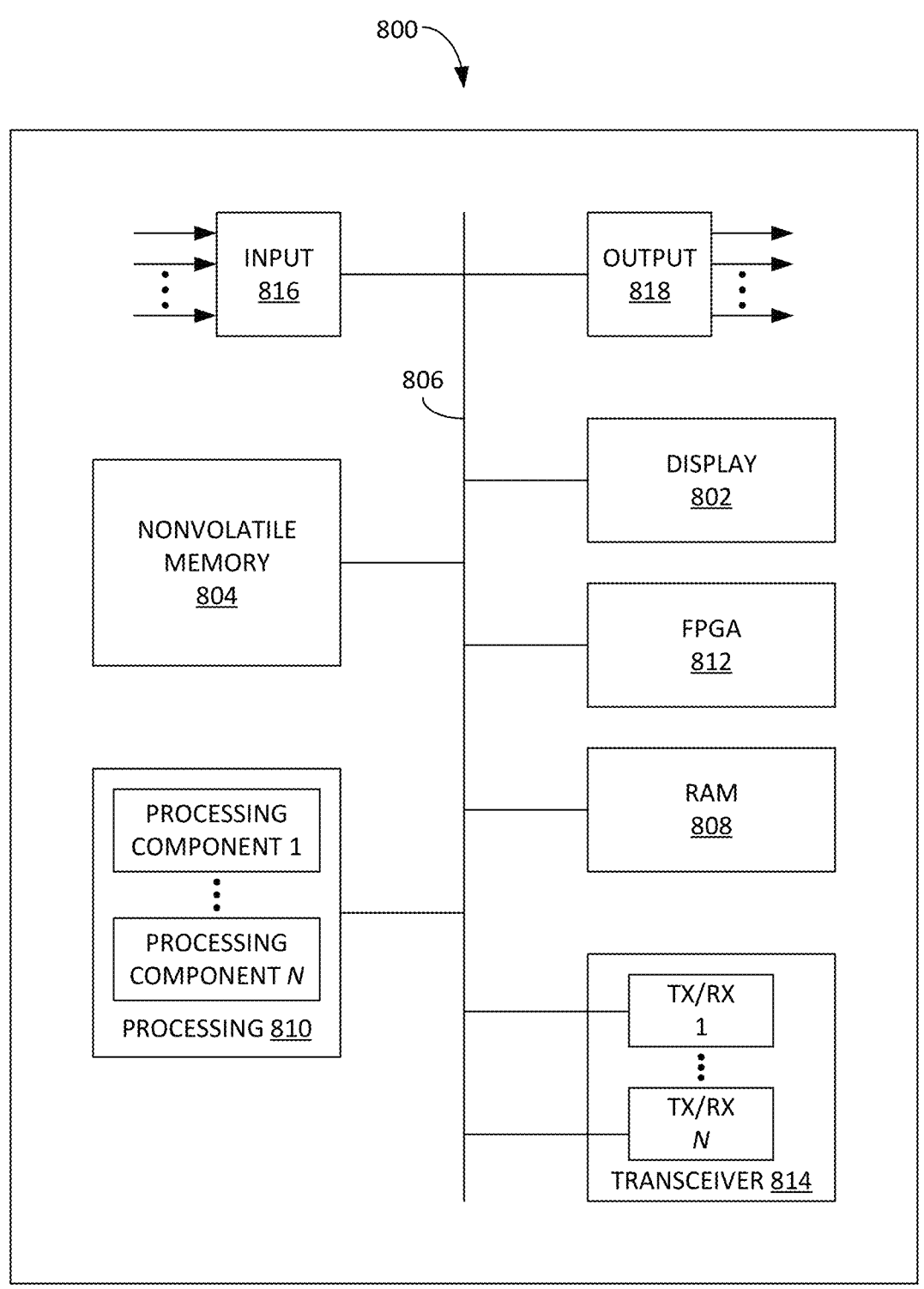
FIG. 8 is a conceptual block diagram depicting a computing system that may be utilized in connection with embodiments disclosed herein.

FIG. 8 is a conceptual diagram of a computing system 800 that may implemented in the MF generator 116 and/or the VHF generator 114. Display portion 802 and nonvolatile memory 804 are coupled to a bus 806 that is also coupled to random access memory (RAM) 808, processing portion 810 that includes N processing components, field programmable gate array (FPGA) 812, and transceiver component 814 that includes N transceivers. Although the components depicted in FIG. 8 represent physical components, FIG. 8 is not intended to be a detailed hardware diagram; thus, many of the components depicted in FIG. 8 may be realized by common constructs or distributed among additional physical components. Moreover, it is contemplated that other existing and yet-to-be developed physical components and architectures may be utilized to implement the functional components described with reference to FIG. 8.

Display portion 802 generally operates to provide a user interface, and in some implementations, is realized by a touchscreen display. Nonvolatile memory 804 is generally a non-transitory memory that functions to persistently store data and machine readable (e.g., processor executable) code, including executable code that is associated with effectuating the methods described herein. In some embodiments, nonvolatile memory 804 includes bootloader code, operating system code, file system code, and non-transitory processor-executable code to facilitate execution of the methods described herein including the methods described with reference to FIGS. 6 and 7.

In some implementations, nonvolatile memory 804 is realized by flash memory (e.g., NAND or ONENAND memory), but it is contemplated that other memory types may be utilized as well. Although it may be possible to execute the code from nonvolatile memory 804, the executable code in nonvolatile memory 804 is typically loaded into RAM 808 and executed by one or more of the N processing components in processing portion 810.

In operation, processing portion 810 in association with RAM 808 may generally operate to execute the instructions stored in nonvolatile memory 804 to realize aspects of frequency tuner 508, and control aspects of VHF generator 114/500, mid-frequency generator 116 and matching network 112. For example, non-transitory processor-executable instructions to effectuate aspects of the methods described with reference to FIGS. 6 and 7 may be persistently stored in nonvolatile memory 804 and executed by processing portion 810 in association with RAM 808. As one of ordinarily skill in the art will appreciate, processing portion 810 may include a video processor, digital signal processor (DSP), graphics processing unit (GPU), and other processing components.

In addition, or in the alternative, FPGA 812 may be configured to effectuate one or more aspects of the methods described herein (e.g., the methods described with reference to FIGS. 6 and 7). For example, non-transitory FPGA configuration instructions may be persistently stored in nonvolatile memory 804 and accessed by FPGA 812 (e.g., during boot up) to configure FPGA 812 to realize aspects of to realize aspects of frequency tuner 508, and control aspects of VHF generator 114/500, mid-frequency generator 116 and matching network 112.

Input component 816 may operate to receive signals (e.g., from sensor 506 and/or the sync line between the VHF and MF generators when the VHF generator is operating as a satellite) that are indicative of one or more aspects of power such as, for example, voltage, current, forward power, reflected power and plasma load impedance. Output component 818 generally operates to provide one or more analog or digital signals to effectuate operational aspects of generators 114/500 and 116. For example, output component 818 may provide control signals utilized by generators 114/500 and 116. And the output component 818 may provide a sync signal when operating as a master device.

Transceiver component 814 includes N transceiver chains, which may be used for communicating with external devices via wireless or wired networks. Each of the N transceiver chains may represent a transceiver associated with a particular communication scheme (e.g., WiFi, Ethernet, Profibus, etc.).

This description is provided to enable any person skilled in the art to make or use the present invention. Various modifications will be readily apparent to those skilled in the art, and the principles disclosed herein may be applied to other embodiments without departing from the spirit or scope of the invention. Thus, the present invention is not limited to the embodiments disclosed herein but is to be accorded the widest scope consistent with the principles and novel features disclosed herein.

The invention claimed is:

1. A plasma processing system comprising:
a very high frequency (VHF) generator configured to deliver power to a plasma chamber; and
a mid-frequency (MF) generator configured to deliver power to the plasma chamber, wherein the VHF generator comprises:
a sensor configured to produce at least one signal indicative of an impedance presented to the VHF generator; and
a frequency tuner configured to:
adjust a frequency of the VHF generator within a cycle of the MF generator based on the at least one signal indicative of the impedance in order to mitigate impedance modulation caused by the MF generator;
decrease the frequency of the VHF generator when the impedance swings away from a target impedance in a first direction; and increase the frequency of the VHF generator when the impedance swings away from the target impedance in a second direction that is opposite from the first impedance.

2. The plasma processing system of claim 1, wherein:
the frequency tuner decreases the frequency of the VHF generator when a sheath capacitance is larger than a target sheath capacitance; and
the frequency tuner increases the frequency of the VHF generator when the sheath capacitance is smaller than the target sheath capacitance.

3. The plasma processing system of claim 1, wherein:
the frequency tuner increases or decreases the frequency of the VHF generator within a range of five percent of a frequency at which the VHF generator normally operates.

4. The plasma processing system of claim 1, wherein the VHF generator delivers power in a frequency range of 10 MHz to 200 MHz, and the MF generator delivers power at a frequency of 400 kHz.

5. The plasma processing system of claim 1, wherein the MF generator applies power in a range of 10 KW to 30 KW to the plasma chamber.

6. The plasma processing system of claim 1, wherein the VHF generator is configured to sustain plasma in the plasma chamber, and the MF generator is configured to bias a substrate in the plasma chamber by applying a periodic voltage function to effectuate a desired distribution of ion energies at a surface of the substrate.

7. A plasma processing system comprising:
a very high frequency (VHF) generator configured to:
deliver power to a plasma chamber;
adjust a frequency of the VHF generator to be lower when an impedance presented to the VHF generator swings away from a target impedance in a first direction; and
adjust the frequency of the VHF generator to be higher when an impedance presented to the VHF generator swings away from the target impedance in a second direction that is opposite from the first impedance; and
a mid-frequency (MF) generator configured to deliver power to the plasma chamber; and
a sync line between the VHF generator and the MF generator for permitting presetting of a frequency of the VHF generator in synchronization with a cycle of the MF generator so as to adjust the frequency of the VHF generator in order to mitigate impedance modulation caused by the MF generator.

8. The plasma processing system of claim 7, wherein the sync line is a line for providing a common exciter (CEX) mode.

9. The plasma processing system of claim 7, wherein the sync line is a line for providing a clock signal.

10. The plasma processing system of claim 7, wherein
the frequency of the VHF generator is adjusted to be lower when a sheath capacitance is larger than a target sheath capacitance; and
the frequency of the VHF generator is adjusted to be higher when the sheath capacitance is smaller than the target sheath capacitance.

11. The plasma processing system of claim 7, wherein
the frequency tuner increases or decreases the frequency of the VHF generator within a range of five percent of a frequency at which the VHF generator normally operates.

12. The plasma processing system of claim 7, wherein the VHF generator delivers power in a frequency range of 10 MHz to 200 MHZ, and the MF generator delivers power at a frequency of 400 KHz.

13. The plasma processing system of claim 7, wherein the MF generator applies power in a range of 10 KW to 30 kW to the plasma chamber.

14. The plasma processing system of claim 7, wherein the VHF generator is configured to sustain plasma in the plasma chamber, and the MF generator is configured to bias a substrate in the plasma chamber by applying a periodic voltage function to effectuate a desired distribution of ion energies at a surface of the substrate.

15. A method for compensation of impedance modulation in a plasma chamber, comprising:
delivering power to the plasma chamber with a very high frequency (VHF) generator;
delivering power to the plasma chamber with a mid-frequency (MF) generator;
adjusting a frequency of the VHF generator in order to mitigate impedance modulation caused by the MF generator;
decreasing the frequency of the VHF generator when a sensed impedance swings away from a target impedance in a first direction; and
increasing the frequency of the VHF generator when the sensed impedance swings away from the target impedance in a second direction that is opposite from the first impedance.

16. The method of claim 15, comprising adjusting the frequency based on an indication of the impedance of a plasma load.

17. The method of claim 15, comprising presetting the frequency of the VHF generator in synchronization with a cycle of the MF generator to mitigate impedance modulation caused by the MF generator.

* * * * *